United States Patent [19]

Dolezal et al.

[11] 4,213,292
[45] Jul. 22, 1980

[54] THERMOELECTRICALLY-POWERED WRIST WATCH

[75] Inventors: Zdenek Dolezal; Urs J. Hof, both of Biel, Switzerland

[73] Assignee: Bulova Watch Company, Inc., Flushing, N.Y.

[21] Appl. No.: 34,012

[22] Filed: Apr. 27, 1979

[30] Foreign Application Priority Data

May 10, 1978 [CH] Switzerland .................... 5060/78

[51] Int. Cl.² .................... G04C 3/00; H02J 7/00
[52] U.S. Cl. .................... 368/204; 320/2; 320/61
[58] Field of Search ........... 58/23 R, 23 BA, 50 R; 307/44, 72; 320/2, 61

[56] References Cited

U.S. PATENT DOCUMENTS

| | | | |
|---|---|---|---|
| 3,509,712 | 5/1970 | Grohoski | 58/23 C |
| 4,008,566 | 2/1977 | McClintock | 58/23 BA |
| 4,106,279 | 8/1978 | Martin et al. | 58/23 BA |

FOREIGN PATENT DOCUMENTS

1331722  5/1963  France .................... 58/23 BA

*Primary Examiner*—Edith S. Jackmon
*Attorney, Agent, or Firm*—Michael Ebert

[57] ABSTRACT

A thermoelectrically-powered wrist watch in which thermal energy picked up by the metal back of the watch casing is transferred to the hot pole of an electrothermal generator housed within the casing. To avoid thermal shunts which cause heat losses and reduce the efficiency of the generator, the metal carrier for the watch movement is thermally insulated from the upper component of the casing which, in turn, is thermally insulated from the back thereof. In addition or alternatively, the casing back is partially constituted by thermal insulation material.

9 Claims, 9 Drawing Figures

THERMOELECTRICALLY-POWERED WRIST WATCH

BACKGROUND OF INVENTION

This invention relates generally to thermoelectrically-powered wrist watches, and more particularly to a wrist watch of this type whose construction is such as to minimize shunt heat losses whereby the thermoelectric generator housed therein operates at high efficiency.

It is known to power analog or digital solid state wrist watches by means of a thermoelectric generator which operates on the Seebeck effect to develop a voltage due to differences in temperature between two junctions of dissimilar metals in the same circuit. In thermoelectrically powered wrist watches of this type, the components of the watch movement are supported on a metal carrier that is held within the watch casing with the major portion of the carrier in close proximity to the metal back of the casing.

The thermoelectric generator is placed within the casing with its hot pole in contact with the casing back. This back, which is of good thermal conductivity, is pressed against the wrist of the wearer to be heated thereby, the cold pole of the generator being in contact with the relatively cool carrier to provide the necessary heat differential for developing the voltage.

Because of the close proximity of the metal carrier to the heated casing back, a transfer of thermal energy takes place therebetween which tends to equalize the temperature. This effectively acts as a thermal shunt or bridge across the thermal generator. The resultant heat loss reduces the efficiency of the generator.

While an undesirable heat transfer can, to some degree, be reduced by filling the space between the metal casing back and the metal carrier for the movement with thermal insulation, such insulation does not satisfactorily solve the problem. A more effective practical solution is to provide a relatively large spacing between the casing back and the metal carrier, but this necessarily results in a casing of greater thickness or height and hence in a watch whose bulky appearance leaves much to be desired in aesthetic or ornamental terms.

SUMMARY OF INVENTION

In view of the foregoing, the main object of this invention is to provide a thermoelectrically-powered wrist watch of the analog or digital type whose construction is such as to minimize shunt heat losses whereby the thermoelectric generator therein operates at high efficiency.

A significant advantage of a wrist watch in accordance with the invention is that it becomes feasible to design and manufacture watches with thinner or flatter casings, thereby creating watches having a more pleasing appearance. Moreover, because the thermoelectric generator has an improved yield, the watch is caused to function in a more reliable manner.

Briefly stated, in a thermoelectrically-powered wrist watch in accordance with the invention, the thermal energy picked up by the back of the watch casing is transferred to the hot pole of an electrothermal generator housed within the casing.

To avoid thermal shunts, in one embodiment of the invention, the metal carrier for the movement is thermally isolated from the upper component of the casing which is thermally isolated from the back thereof. An alternative expedient for this purpose is a casing back constituted in part by thermal insulation material. In practice, both expedients may be combined to advantage. Because of the reduced transfer of heat from the casing back to the carrier, it becomes possible to provide thermoelectrically-powered wrist watches which are of flatter or thinner construction than existing forms of such watches.

OUTLINE OF DRAWINGS

For a better understanding of the invention as well as other objects and further features thereof, reference is made to the following detailed description to be read in conjunction with the accompanying drawings, wherein.

DESCRIPTION OF INVENTION

Prior Art

Figure 1:
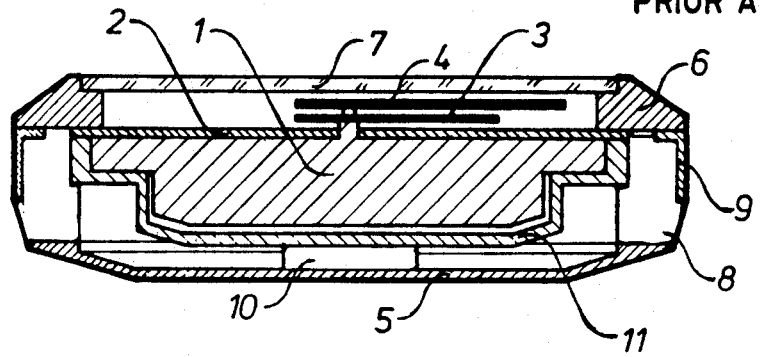
FIG. 1 is a sectional view taken through a prior art type of thermoelectrically-powered wrist watch.

Referring now to FIG. 1, there is shown a known form of thermoelectrically-powered wristwatch, such as that disclosed in Swiss provisional patent 5879/75 (Swiss Pat. No. 604,249). The movement of this watch includes a rechargeable storage battery, an integrated solid state circuit energized by the battery for supplying timing pulses to a stepping motor which drives the time-indicating hands 3 and 4 of the watch through a gear train.

The movement, which is generally identified by reference numeral 1, further includes a metal carrier which is milled to provide recesses or compartments to accommodate the storage battery, the integrated circuit, the stepping motor and the gear train. Hands 3 and 4 are mounted on a central shaft and are readable against a dial plate 2. The watch casing is formed with a metal back 5 which normally rests on the wrist of the wearer, a bezel 6 which encircles the watch crystal 7 and a cylindrical, heat-insulating frame 8 of plastic material. To improve heat radiation, a metal shell 9 surrounds frame 8, shell 9 being in thermal contact with bezel 6.

The carrier of movement 1 is seated within an inner metal case 11, while sandwiched between case 11 and back 5 of the casing is a thermoelectric generator 10. Generator 10 operates in accordance with the Seebeck effect and is usually referred to as a Peltier battery. The hot pole of generator 10 is in thermal contact with casing back 5, whereas the cold pole thereof is in thermal contact with the inner case 11. Because of the temperature differential between the relatively hot casing back and the cooler metal case 11, generator 10 produces an output voltage which serves to recharge the storage battery of the watch. Thus there is no need to replace the battery, for the battery is maintained in the charged state by the thermoelectric generator through heat energy derived from the wearer of the watch.

This charging operation is carried out in a conventional manner, normally with the aid of an electronic voltage chopper that converts the d-c output of the generator into an a-c voltage that is applied to a step-up transformer whose output is rectified. Thus it is the temperature differential between the casing back that is heated by the wearer of the watch and the remaining portion of the casing which is thermally insulated from the casing back and is cooled by the free atmosphere that is exploited to supply the electrical energy for powering the watch movement.

Improvements

Figure 2:
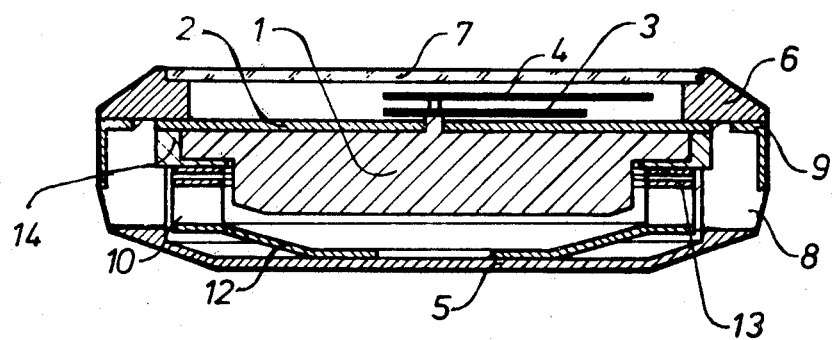
FIGS. 2, 3 and 4 illustrate, in section, three different wrist watch constructions, each of which constitutes an improvement over the construction shown in FIG. 1.
Figure 3:
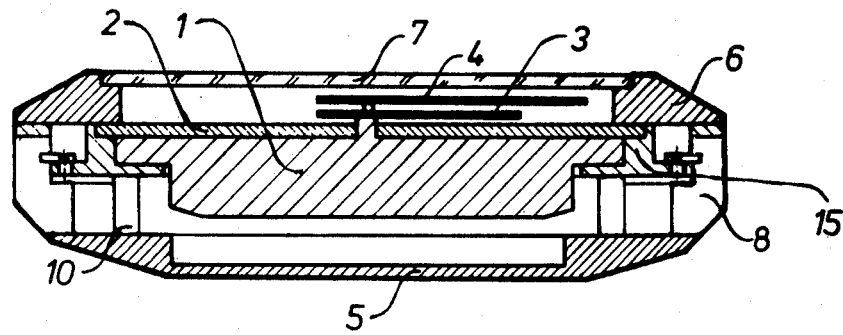
Figure 4:
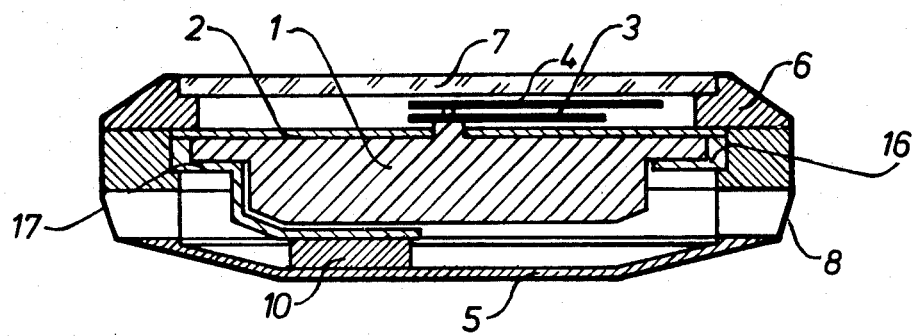

The watches illustrated in FIGS. 2, 3 and 4, though representing different improvements over the prior art watch shown in FIG. 1, basically operate on the same principle; hence the reference numerals employed are the same for FIGS. 2, 3, and 4 insofar as identical or similar components are involved.

In the analog watch shown in FIG. 2, the movement 1 is again insulated from back 5 of the casing. However, thermal generator 10, instead of being in the wafer form shown in FIG. 1, assumes an annular configuration to surround movement 1.

To transmit heat from back 5 of the casing, an elastic metal plate 12 is provided, the plate conveying the heat to the hot pole of generator 10. Generator 10 is supported via a shock absorber 13 on an intermediate ring 14 that encircles the upper end of the movement and is practically at the same temperature as movement 1, bezel 6 and crystal 7. Shock absorber 13 is constituted by two flat metal rings and a spring system connecting the plates together as by Z springs, undulated flat springs or the like.

The annular thermoelectric generator 10 shown in FIG. 3 is, of course, composed of several individual elements, the generator being sandwiched between back 5 of the casing and a mounting ring 15 which serves to hold fast the movement 1. Ring 15 is locked to the insulating frame 8 by means such as eccentric screws.

In the watch arrangement illustrated in FIG. 4, the thermal generator 10, which is again in wafer form, is disposed in the space between the metal back 5 of the casing and a flat metal spring 17 which protrudes from a mounting ring 16 encircling movement 1.

The thermoelectric wrist watches disclosed hereinabove all possess a common feature despite their differences in construction. In each of these watches, the major portion of movement 1 and its metal carrier lies directly opposite the back 5 of the casing which is heated by the wrist of the wearer and is of good thermal conductivity.

Laboratory tests have shown that the transfer of energy which takes place between the heated back 5 of the casing and the portion of the watch movement which faces this back and which initially is at a lower temperature, gives rise to equalization of the back and movement temperatures. This equalization is, of course, undesirable. In other words, the transfer of thermal energy in effect acts to partially short circuit the thermoelectric generator whose operation depends on a temperature differential. This thermal shunt or thermal bridge reduces the efficiency of the generator.

The Invention

In order to provide thermoelectrically-powered wrist watches having only slight heat shunt losses and to make possible the manufacture and more efficient watches of this type in flatter or thinner casings and therefore of more pleasing design, a watch in accordance with the invention provides a metal carrier for the watch movement which is thermally insulated from the upper component of the watch casing which in turn is thermally insulated from the casing back. At least a portion of the back which is opposite to the metal carrier is of thermal insulation material.

The invention is based on the above-defined relationship and also on the concept that a significant improvement is only possible if one sees to it that in the vicinity of the casing back, the region of coincidence or the overlapping surface between the thermally-conductive back and the components thermally connected to the relatively cold casing is minimized.

FIGS. 5 to 9 show five different embodiments of the invention. In each figure, the cross-section is taken in a manner whereby the central axis of the movement lies in the plane of the section. In these figures, the same reference numerals are used as in FIGS. 1 to 4 to identify corresponding or comparable components.

Figure 5:
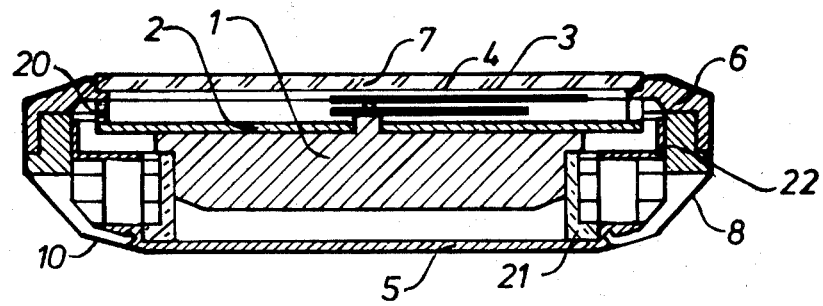
FIGS. 5, 6, 7, 8 and 9, respectively illustrate, in section, five different embodiments of a thermoelectrically-powered wrist watch in accordance with the invention.

In the first embodiment of a thermoelectrically-powered analog wrist watch illustrated in FIG. 5, the metal carrier of the movement 1 is thermally insulated both with respect to the relatively cold bezel 6 and with respect to the metal back 5 of the casing. For purposes of such insulation, two rings 20 and 21 are provided to hold the movement in the position shown. Ring 20 is interposed between dial 2 and bezel 6, while ring 21 is interposed between metal back 5 and an upper shoulder in movement 1. Rings 20 and 21 are fabricated of a plastic material having good thermal insulation properties, so that the rings are effectively non-conductive with respect to heat.

Thermal generator 10, which is in annular form, is interposed between the metal back 5 and a "cold" metal ring 22 in contact with the metal shell of the casing. In practice, additional centering elements may be provided to insure the positioning of the watch components as above described.

Due to the heat barrier between movement 1 and bezel 6, when the watch is in use on the wrist of the wearer, the movement will assume a temperature at a level between the "cold" temperature of the casing component insulated from back 5 by the frame component 6. Bezel 6 is the coldest component of the casing and metal back 5 the hottest component.

Consequently, the shunt path which diverts heat away from the hot pole to the cold pole of the thermal generator has a considerably greater resistance, so that the ultimate effect is to feed more thermal energy from the wrist of the wearer to the generator and to supply a greater amount of electrical power to the movement. Indeed, both the space between crystal 7 of the watch and its dial 2 and the space between movement 1 and back 5 here act as heat barriers.

Figure 6:
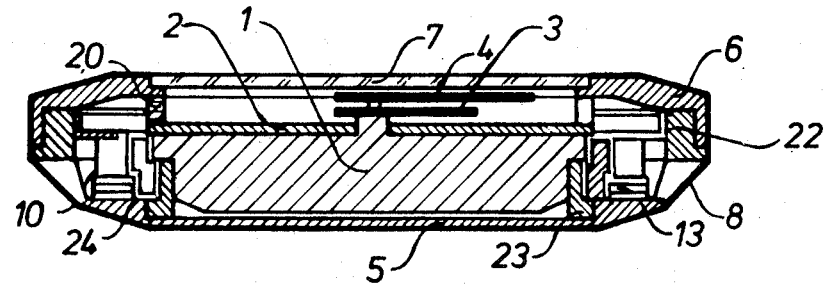

By dispensing with the hollow space between casing back 5 and movement 1 in the arrangement illustrated in FIG. 6, one can thereby produce an especially flat watch design. In this embodiment, movement 1 extends into the immediate vicinity of back 5 and is thermally coupled thereto by a mounting ring 23. On the other hand, movement 1 is thermally isolated from the cold casing components by insulating ring 20.

The space within bezel 6 is active as a thermal barrier. An insulating ring 24 surrounding movement 1 contributes to a further reduction in heat shunt losses. It is also to be noted in FIG. 6 that generator 10 is spring mounted by means of a shock absorber 13 and is thereby protected against breaking.

The main advantage of a watch in accordance with the second embodiment in FIG. 6, as compared to those illustrated in FIGS. 1 to 4, lies in the space savings effected by eliminating the heat-barrier space between the movement and the back of the casing. This task is taken over by the thermal separation of bezel 6 and movement 1, which separation space is in any event present between movement 1 and crystal 7.

Figure 7:
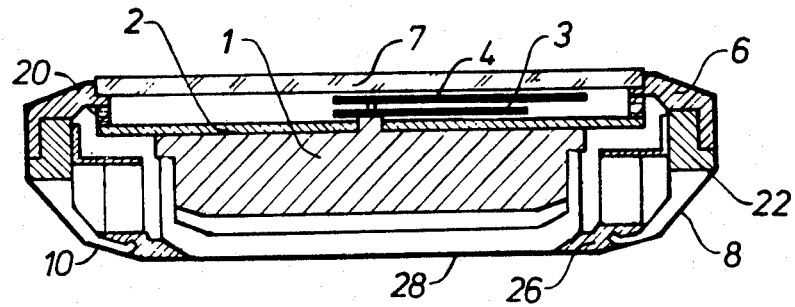

In the third embodiment of the watch illustrated in FIG. 7, use is also made of the principle of thermal separation between movement 1 and the cold components of the casing. In addition to this expedient, means are provided to further enhance the energy efficiency of the system. To this end, instead of a continuous metal casing back, the back is of multipartite construction and comprises a metal ring 26 and a central component 28 seated therein which is formed of a heat-insulating plastic material and at the same time functions as a supporting cup for movement 1.

Thermal generator 10, which in this instance is in annular form, has its hot pole resting on metal ring 26 to receive heat from the wrist of the user against which the ring is pressed, the cold pole of the generator being in contact with the "cold" metal ring 22 of the casing.

This embodiment of the watch has a particularly advantageous thermal economy; for on one hand the movement is thermally isolated from the cold casing components, and on the other hand the movement faces the central component 28 of the casing back which is thermally non-conductive.

Figure 8:
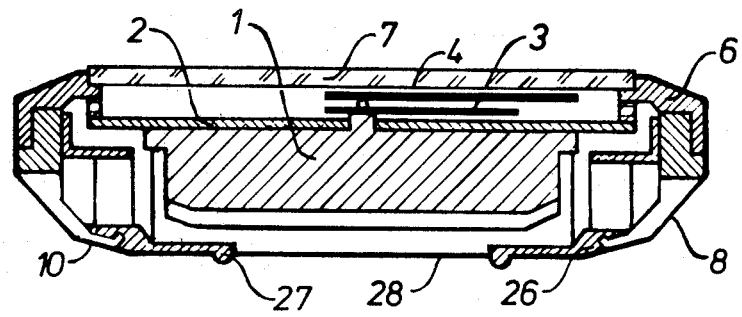

The fourth embodiment in FIG. 8 of the thermoelectrically-powered watch is almost identical to the embodiment shown in FIG. 7, the only difference being in the shape of ring 26 which is preferably made of a metal of high thermal conductivity. This ring is somewhat broader than the metal ring shown in FIG. 7 and is provided along its inner periphery with a protruding bead 27 which engages the skin of the wearer in order to improve body heat transfer to the thermoelectric generator 10.

Figure 9:
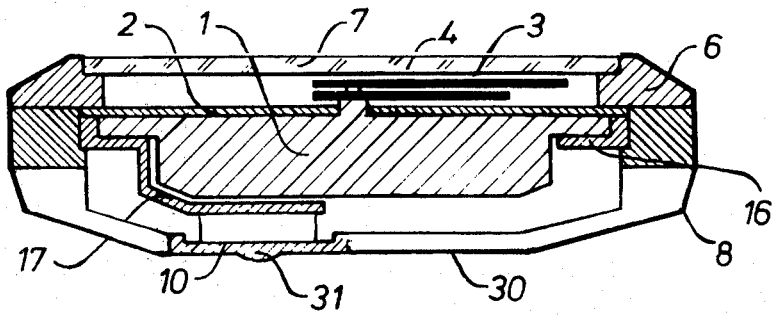

Finally, in the fifth embodiment of the invention shown in FIG. 9, movement 1 is not thermally separated from the cold component of the case. In this arrangement, heat losses between the back of the casing and the movement are minimized by extending heat-insulating frame 8 of the casing downwardly to form an essential part of the casing back portion 30. Into this back portion of frame 8 there is pressed a relatively small metal plate 31, whose inside surface is bonded to the hot pole of the thermoelectric generator 10 by means of a heat-conductive but electrically-insulating cement such as silicone rubber. The cold pole of generator 10 engages a metal spring 17 which extends from metal mounting ring 16 on which the upper flange of movement 1 is seated. In this instance, generator 11 may have a circular or square wafer shape. A further improvement is obtainable in the embodiment of FIG. 9 by thermal separation of movement 1 and bezel 6.

It will be evident from the foregoing description of the five embodiments of the invention that both the thermal insulation of the carrier for the movement and the reduction in the size of the heat conductive section of the back contribute to conducting the flow of thermal energy to the greatest extent possible to the thermoelectric generator, thereby minimizing flow into thermal shunt paths which interfere with the efficiency of the generator. It is advisable, therefore, to apply both measures simultaneously in order to obtain optimum results.

Although we have only illustrated analog watches—that is, watches with hands—the principles underlying the invention can also be advantageously employed in a digital watch. It is merely necessary that the essential parts of the movement consist of metal or other thermally-conductive material. This applies in particular to the carrier for the movement. In this connection, the carrier need not accommodate all components of the movement. For example, the metal carrier could merely carry the train of gears and a stepping motor, this carrier being otherwise supported by another carrier of plastic or the like.

Further improvements can be realized, for instance, by using a dial formed of a heat-insulating plastic or of a metal which is heat-insulated by a layer of plastic from the movement carrier. Moreover, the heat losses can be reduced by filling up the hollow spaces (for instance, between the movement and the casing back) by a plastic of very poor heat conductivity. Polyurethane foamed with trichlorofluoromethane (Freon) is suitable for this.

In the foregoing description, the thermally conductive components have been referred to for the sake of simplicity as metallic elements, etc. It is clear that the nature or chemical composition of these components is not important; the essential factor being the thermal conductivity of the material. A non-metallic material of high thermal conductivity may possibly have the same or similar properties in this respect as a metal and is therefore to be considered as the equivalent thereof.

The watchband fastening means have not been shown in the drawing. The horns for the attachment of the pins which hold the ends of the watchband should, of course, not bridge the casing components which are thermally insulated from each other. If the horns are integral with the bezel or some other cold casing component, it must be seen to it that when the watch is worn, they cannot rest against the wrist.

While there have been shown and described preferred embodiments of a thermoelectrically-powered wrist watch in accordance with the invention, it will be appreciated that many changes and modifications may be made therein without, however, departing from the essential spirit thereof.

We claim:

1. A thermoelectrically-powered wrist watch comprising:
   A a casing having an upper component exposed to the atmosphere and therefore relatively cool and a back structure provided with a metallic section in physical contact with the wrist of the wearer and heated thereby;
   B an electronic watch movement housed in said casing and including a rechargeable battery to power said movement, said movement including a metallic carrier which is thermally insulated from the upper component of said casing and is also thermally insulated from the metallic section of said back structure; and
   C an electric generator disposed in said housing to produce a voltage for charging said battery, said generator having a hot pole thermally coupled to said metallic back section and a cold pole thermally coupled to said upper component of the casing.

2. A wrist watch as set forth in claim 1, wherein said back structure further includes a non-conductive section formed of thermal insulation and wherein the underside of said metal carrier faces said non-conductive section to minimize heat transfer thereto from the back structure.

3. A wrist watch as set forth in claim 1, wherein said thermoelectric generator is in annular form and surrounds the movement in the casing.

4. A wrist watch as set forth in claim 1, wherein said casing further includes an intermediate section which joins said upper section to said back structure, the intermediate section being formed of thermal insulation material.

5. A wrist watch as set forth in claim 1, wherein said intermediate section is surrounded by a metal shell.

6. A wrist watch as set forth in claim 1, wherein said thermoelectric generator is disposed within said casing between the underside of said movement and said back structure, said back structure having a metal section in thermal contact with said generator and being otherwise composed of thermal insulating plastic material.

7. A wrist watch as set forth in claim 1, wherein said watch further includes a dial which is disposed above said movement and is thermally insulated therefrom.

8. A wrist watch as set forth in claim 1, wherein said generator is supported within said casing on a heat-conductive shock absorber.

9. A wrist watch as set forth in claim 1, wherein said movement is that of an analog watch and includes a stepping motor to drive the hands of the watch.

* * * * *